United States Patent [19]
Jang et al.

[11] Patent Number: 5,552,344
[45] Date of Patent: Sep. 3, 1996

[54] NON-ETCHBACK SELF-ALIGNED VIA SIZE REDUCTION METHOD EMPLOYING OZONE ASSISTED CHEMICAL VAPOR DEPOSITED SILICON OXIDE

[75] Inventors: Syun-Ming Jang, Hsin-chu; Chen-Hua D. Yu, Keelung, both of Taiwan

[73] Assignee: Taiwan Semiconductor Manufacturing Company, Hsin-chu, Taiwan

[21] Appl. No.: 559,051

[22] Filed: Nov. 16, 1995

[51] Int. Cl.$^6$ .................................................. H01L 21/443
[52] U.S. Cl. ........................ 437/195; 437/228; 427/255.1; 427/97
[58] Field of Search ..................................... 437/195, 228, 437/192, 238; 427/97, 255.1, 255.3

[56] References Cited

U.S. PATENT DOCUMENTS

| | | | |
|---|---|---|---|
| 4,988,643 | 1/1991 | Tsou | 437/200 |
| 5,342,808 | 8/1994 | Brigham et al. | 437/228 |

Primary Examiner—George Fourson
Assistant Examiner—C. Everhart
Attorney, Agent, or Firm—George O. Saile; Alek P. Szecsy

[57] ABSTRACT

A method for forming a narrow cross-sectional diameter via through an insulator layer for use within an integrated circuit. Formed upon a semiconductor substrate is a metal layer. At least the top surface of the metal layer is formed from a titanium nitride layer. Formed upon the titanium nitride layer is an insulator layer. The insulator layer exhibits a first incubation time with respect to forming an ozone assisted Chemical Vapor Deposited (CVD) silicon oxide insulator coating upon the insulator layer. The first incubation time is less than a second incubation time for forming the same ozone assisted Chemical Vapor Deposited (CVD) silicon oxide insulator coating upon the titanium nitride layer. A conventional via is then formed completely through the insulator layer. The bottom of the conventional via exposes a portion of the titanium nitride layer. Formed upon the surface of the insulator layer and upon the edges of the insulator layer exposed within the conventional via is an ozone assisted Chemical Vapor Deposited (CVD) silicon oxide insulator coating. The ozone assisted Chemical Vapor Deposited (CVD) silicon oxide insulator coating is deposited for a deposition time greater than the first incubation time, but no greater than the second incubation time.

21 Claims, 6 Drawing Sheets

NON-ETCHBACK SELF-ALIGNED VIA SIZE REDUCTION METHOD EMPLOYING OZONE ASSISTED CHEMICAL VAPOR DEPOSITED SILICON OXIDE

BACKGROUND OF THE INVENTION

1. Field of the Invention

The present invention relates generally to insulator layers formed within integrated circuits. More particularly, the present invention relates to a non-etchback self-aligned method for reducing the sizes of vias formed through insulator layers within integrated circuits.

2. Description of the Related Art

As a consequence of the ever increasing demands for integrated circuit function and performance, advanced generations of integrated circuits have shown a corresponding increase in levels of integration. Some aspects of advanced integrated circuit function and performance demands may be accommodated through increased vertical integration of advanced integrated circuits. Increased vertical integration is accomplished by incorporating additional conductor and interconnect levels within those integrated circuits. However, far greater levels of integrated circuit function and performance increases are typically achieved through increased horizontal integration of advanced integrated circuits. Increased horizontal integration of advanced integrated circuits requires continuing decreases in integrated circuit device dimensions, integrated circuit conductor dimensions and integrated circuit insulator dimensions.

Traditionally, increases in horizontal integration have required corresponding advances in photolithographic and etching processes through which intricate semiconductor features are formed within and/or upon the surfaces of semiconductor substrates. These advances have guided conventional photolithographic methods and materials from exposure wavelengths in the visible and near ultraviolet regions to exposure wavelengths in the deep ultraviolet region. Most recently, these advances have guided advanced photolithographic methods and materials to exposure wavelengths in the x-ray wavelength region.

While the demands for increased integrated circuit functionality and performance will no doubt continue to increase, such increases place a substantial and continuing burden upon the photolithographic and etching processes which are typically employed in forming the integrated circuit devices with the reduced feature sizes that are needed to fulfill the functionality and performance demands. The burden is both technological and economic. It is thus towards the goal of producing advanced integrated circuits having decreased feature sizes without the need for improved photolithographic and etching processes that the present invention is directed.

Methods through which decreased feature sizes within advanced integrated circuits may be achieved without the need for fundamental advances in photolithographic and etching methods are known in the art. For example, Brigham et al., in U.S. Pat. No. 5,342,808 disclose a method for controlling the size of etched vias and metal contacts within insulator layers employed in integrated circuits. The method involves forming a via through an insulator layer by means of standard photolithographic and etching methods. At the bottom of the via is optionally exposed an underlying metal layer. Into the via is then formed a conformal insulator layer which is subsequently anisotropically etched to remove the portion of the insulator layer at the bottom of the via, thus exposing the metal layer. The anisotropic etching leaves residual conformal insulator layer material on the sidewalls of the via. Through the disclosed method there may be provided a via of substantially reduced cross-sectional diameter without need for fundamental advances in photolithographic or etching methods.

Desirable in the art are methods which expand from the disclosure of Brigham et al., and provide additional methods for forming narrow cross-sectional diameter vias through insulator layers within advanced integrated circuits, preferably without the need for fundamental advances in photo lithographic or etching technology. Most desirable are methods which require no additional etching of a narrow cross-sectional diameter via, once formed.

SUMMARY OF THE INVENTION

An object of the present invention is to provide a method for forming a narrow cross-sectional diameter via through an insulator layer within an advanced integrated circuit without the need for fundamental advances in photolithographic or etching technology.

A second object of the present invention is to provide a method in accord with the foregoing object of the present invention, which method also requires no additional etching of a narrow cross-sectional diameter via, once formed.

A third object of the present invention is to provide a method in accord with the foregoing objects of the present invention, which method is also manufacturable.

A fourth object of the present invention is to provide a method in accord with the foregoing objects of the present invention, which method is also economical.

In accord with the objects of the present invention, a new method for forming a narrow cross-sectional diameter via within an insulator layer employed in an integrated circuit is disclosed. To form the narrow cross-sectional diameter via through the method of the present invention, there is first formed upon a semiconductor substrate a metal layer. At least the top surface of the metal layer is formed from a titanium nitride layer. Formed upon the titanium nitride layer is an insulator layer. The insulator layer exhibits a first incubation time with respect to forming an ozone assisted Chemical Vapor Deposited (CVD) silicon oxide insulator coating upon the insulator layer. The first incubation time is less than a second incubation time for forming the same ozone assisted Chemical Vapor Deposited (CVD) silicon oxide insulator coating upon the titanium nitride layer. Formed then completely through the insulator layer is a conventional via. At the bottom of the conventional via there is exposed a portion of the titanium nitride layer. Formed upon the surface of the insulator layer and upon the edges of the insulator layer exposed in the conventional via is an ozone assisted Chemical Vapor Deposited (CVD) silicon oxide insulator coating. The ozone assisted Chemical Vapor Deposited (CVD) silicon oxide insulator coating is deposited for a deposition time greater than the first incubation time, but no greater than the second incubation time.

The method of the present invention provides a narrow cross-sectional diameter via through an insulator layer within an advanced integrated circuit, without the need for fundamental advances in photolithographic or etching technology. The method of the present invention provides that a conventional via formed through an insulator layer within an integrated circuit may be narrowed in cross-sectional diameter. The conventional via may be narrowed in cross-sectional diameter through selectively forming upon the edges of the insulator layer exposed within the conventional via, but not upon the portion of a titanium nitride layer which is exposed at the bottom of the conventional via, an Ozone assisted Chemical Vapor Deposited (CVD) silicon oxide insulator coating. The method of the present invention relies upon the existence of a shorter incubation time for forming an ozone assisted Chemical Vapor Deposited (CVD) silicon oxide insulator coating upon the edges of an insulator layer exposed within a conventional via etched through the insulator layer than the incubation time for forming the same ozone assisted Chemical Vapor Deposited (CVD) silicon oxide insulator coating upon the portion of a titanium nitride layer exposed at the bottom of the same conventional via. The method of the present invention does not require fundamental advances in photolithographic or etching technology.

The method of the present invention requires no additional etching of a narrow cross-sectional diameter via, once formed. The method of the present invention relies upon the existence of a shorter incubation time for forming an ozone assisted Chemical Vapor Deposited (CVD) silicon oxide insulator coating upon the edges of an insulator layer exposed within a conventional via etched through the insulator layer, in comparison with a longer incubation time for forming the same ozone assisted Chemical Vapor Deposited (CVD) silicon oxide insulator coating upon the portion of a titanium nitride layer exposed at the bottom of the same conventional via. By choosing a deposition time for the ozone assisted Chemical Vapor Deposited (CVD) silicon oxide insulator coating between the shorter incubation time and the longer incubation time, there may be formed an ozone assisted Chemical Vapor Deposited (CVD) silicon oxide insulator coating upon the edges of the insulator layer exposed within the conventional via, but not upon the exposed portion of the titanium nitride layer at the bottom of the same conventional via. The selective added thicknesses of the ozone assisted Chemical Vapor Deposited (CVD) silicon oxide insulator coating upon the edges of the insulator layer within the conventional via forms a narrow cross-sectional diameter via from the conventional via. Thus, no additional etching of the narrow cross-sectional diameter via, once formed, is required to access the exposed surface of the titanium nitride layer at the bottom of the narrow cross-sectional diameter via.

The method of the present invention is readily manufacturable. Methods and materials through which ozone assisted Chemical Vapor Deposited (CVD) silicon oxide insulator coatings may be formed upon semiconductor substrate surfaces are known in the art. The method of the present invention requires primarily that an ozone assisted Chemical Vapor Deposited (CVD) silicon oxide insulator coating be formed for a deposition time: (1) greater than the short incubation time for forming the same ozone assisted Chemical Vapor Deposited (CVD) silicon oxide insulator coating upon the exposed edges of an insulator layer within a conventional via, and (2) less than the long incubation time for forming the same ozone assisted Chemical Vapor Deposited (CVD) silicon oxide insulator coating upon the exposed portion of a titanium nitride layer at the bottom of the same conventional via. Forming an ozone assisted Chemical Vapor Deposited (CVD) silicon oxide insulator coating within these time constraints is a manufacturable method for forming a narrow cross-sectional diameter via.

The method of the present invention is economical. The method of the present invention provides that a narrow cross-sectional diameter via may be formed within an insulator layer within an integrated circuit. The method of the present invention provides for selectively depositing upon the exposed edges of an insulator layer through which is formed a conventional via, but not upon the exposed portion of a titanium nitride layer at the bottom of the same conventional via, an ozone assisted Chemical Vapor Deposited (CVD) silicon oxide insulator coating. In comparison with other methods for forming narrow cross-sectional diameter vias, which methods typically employ advanced photolithographic and/or etching processes, the method of the present invention is quite economical.

BRIEF DESCRIPTION OF THE DRAWINGS

The accompanying drawings, which form a material part of this disclosure, show the following.

DESCRIPTION OF THE PREFERRED EMBODIMENTS

Figure 1:
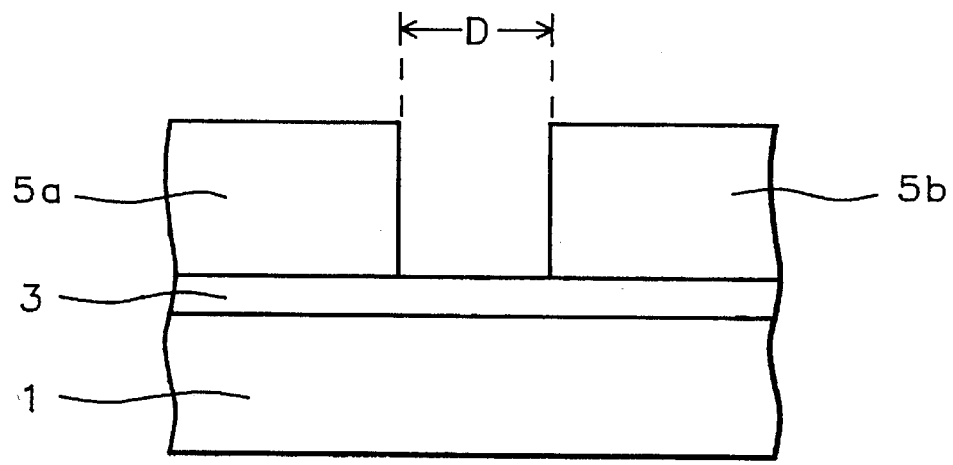
FIG. 1 and FIG. 2 show a pair of schematic cross-sectional diagrams illustrating progressive stages in forming a general embodiment of the present invention, which general embodiment forms the first preferred embodiment of the narrow cross-sectional diameter via of the present invention.

The present invention provides a method for forming a narrow cross-sectional diameter via within an insulator layer within an integrated circuit. The method of the present invention through which the narrow cross-sectional diameter via is formed within the insulator layer does not require fundamental advances in photolithographic and/or etching methods through which conventional vias have been formed. In addition, the method of the present invention through which is formed the narrow cross-sectional diameter via also does not require any additional etching of the narrow cross-sectional diameter via, once formed. Finally, the method through which is formed the narrow cross-sectional diameter via of the present invention within an insulator layer within an integrated circuit is both manufacturable and economical.

The method of the present invention provides that a narrow cross-sectional diameter via may be formed within an insulator layer within an integrated circuit from a conventional via formed within the same insulator layer within the same integrated circuit. Upon the edges of the insulator layer exposed within the conventional via, but not upon the exposed portion of a titanium nitride layer at the bottom of the conventional via there is selectively deposited an ozone assisted Chemical Vapor Deposited (CVD) silicon oxide insulator coating. The selective deposition of the ozone assisted Chemical Vapor Deposited (CVD) silicon oxide insulator coating results from a longer incubation time for forming the ozone assisted Chemical Vapor Deposited (CVD) silicon oxide insulator coating upon the exposed portion of the titanium nitride layer at the bottom of the conventional via than upon the exposed edges of the insulator layer within the conventional via. The existence and the magnitude of the incubation times have been experimentally observed.

The method of the present invention may be practiced in forming a narrow cross-sectional diameter via within an insulator layer within an integrated circuit, provided that the incubation time for forming an ozone assisted Chemical Vapor Deposited (CVD) silicon oxide insulator coating upon the edges of the insulator layer exposed within a conventional via formed through the insulator layer is less than the incubation time for forming the same ozone assisted Chemical Vapor Deposited (CVD) silicon oxide insulator coating upon the exposed portion of a titanium nitride layer at the bottom of the same conventional via.

The method of the present invention may be employed in forming narrow cross-sectional diameter vias within any insulator layer within an integrated circuit wherein there is needed a narrow cross-sectional diameter via. The method of the present invention may be employed in forming narrow cross-sectional diameter vias within the first insulator within an integrated circuit. The first insulator layer within an integrated circuit directly adjoins a semiconductor substrate. Alternatively, the method of the present invention may be employed in forming narrow cross-sectional diameter vias within upper insulator layers which separate metal layers within integrated circuits. The method of the present invention has broad applicability in forming narrow cross-sectional diameter vias within insulator layers within integrated circuits.

In addition to the broad applicability of the method of the present invention in providing narrow cross-sectional diameter vias within insulator layers within integrated circuits, the method of the present invention also has broad applicability in providing narrow cross-sectional diameter vias within insulator layers within various types of integrated circuits. The method of the present invention may be employed in forming narrow cross-sectional diameter vias within insulator layers which are formed within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications field effect transistors, integrated circuits having within their fabrications bipolar transistors and integrated circuits having within their fabrications Bipolar Complementary Metal Oxide Semiconductor (BiCMOS) transistors. The method of the present invention has broad applicability within various types of integrated circuits.

Figure 2:
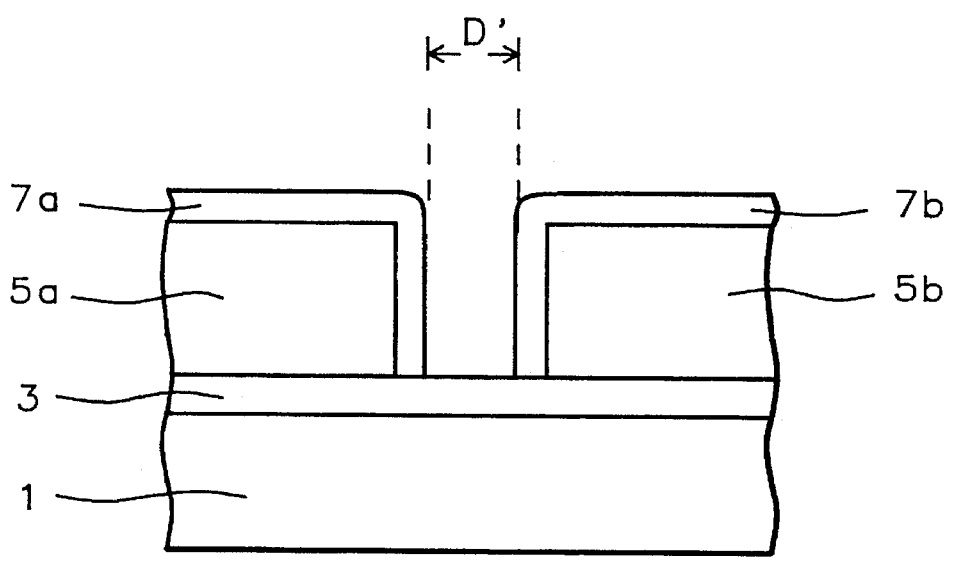

Referring now to FIG. 1 and FIG. 2 there is shown a pair of schematic cross-sectional diagrams which illustrate the general embodiment of the method by which is formed the narrow cross-sectional diameter via of the present invention. The general embodiment of this method represents the first preferred embodiment of the present invention.

Shown in FIG. 1 is a substrate layer 1 upon which resides a titanium nitride layer 3. Upon the titanium nitride layer 3 there in turn resides a pair of patterned insulator layers 5a and 5b which define a conventional via of diameter D, at the bottom of which via is exposed a portion of the titanium nitride layer 3. For the first preferred embodiment of the present invention, the nature of the substrate layer 1 is not important. However, for the first preferred embodiment of the present invention, and many additional embodiments of the present invention, the substrate layer 1 will typically be a conductor metal layer and the titanium nitride layer 3 which resides upon the substrate layer 1 will typically be a titanium nitride barrier metal layer residing upon the surface of the conductor metal layer.

The titanium nitride layer 3 is an important component of the present invention. It is important that the titanium nitride layer 3 reside directly beneath the patterned insulator layers 5a and 5b. In general, there are several methods and materials known in the art through which titanium nitride layers may be formed upon semiconductor substrates. Titanium nitride layers may be formed upon semiconductor substrates through methods including but not limited to Chemical Vapor Deposition (CVD) methods and Physical Vapor Deposition (PVD) sputtering methods. The individual methods employ either titanium and nitrogen source materials, or a titanium nitride source target, as is appropriate to the method.

For the first preferred embodiment of the present invention, the titanium nitride layer 3 is preferably from about 1000 to about 1400 angstroms thick and the titanium nitride layer 3 is preferably formed upon the surface of the substrate layer 1 through a Physical Vapor Deposition (PVD) sputtering process employing a titanium nitride source target.

The patterned insulator layers 5a and 5b are also important component layers in forming the narrow cross-sectional diameter via of the first preferred embodiment of the present invention. The patterned insulator layers 5a and 5b are formed by means of photolithographic patterning and etching through methods as are conventional in the art of a blanket insulator layer which is formed upon the surface of the titanium nitride layer 3. Typically, the etching will be accomplished through a Reactive Ion Etch (RIE) etch process employing an etchant gas mixture appropriate to the material from which is formed the blanket insulator layer.

Two features of the patterned insulator layers 5a and 5b are important in forming the narrow cross-sectional diameter via of the first preferred embodiment of the present invention. The first feature is that the conventional via between the patterned insulator layer 5a and the patterned insulator layer 5b must be completely etched to expose a portion of the surface of the titanium nitride layer 3. The second feature is that the patterned insulator layers 5a and 5b must exhibit an incubation time with respect to forming an ozone assisted Chemical Vapor Deposited (CVD) silicon oxide insulator coating upon the patterned insulator layers 5a and 5b less than an analogous incubation time for forming the same ozone assisted Chemical Vapor Deposited (CVD) silicon oxide insulator coating upon the titanium nitride layer 3. Thus, although there are several methods and materials through which insulator layers may in general be formed within integrated circuits, not all methods and materials will necessarily fulfill the incubation time requirements for the first preferred embodiment of the present invention.

It has been found experimentally that silicon oxide materials formed through certain Chemical Vapor Deposition (CVD) methods fulfill the incubation time requirements for the first preferred embodiment of the present invention. Thus, the insulator layers 5a and 5b are preferably formed from silicon oxide insulator materials deposited through a Chemical Vapor Deposition (CVD) method or a Plasma Enhanced Chemical Vapor Deposition (PECVD) method. The methods typically employ as a silicon source material Tetra Ethyl Ortho Silicate (TEOS), although other silicon source materials, such as silane, may also be employed. Preferably, the thickness of the patterned insulator layers 5a and 5b, and the blanket insulator layer from which is formed the patterned insulator layers 5a and 5b is from about 15000 to about 20000 angstroms. Preferably, the diameter, D, of the conventional via between the patterned insulator layers 5a and 5b is from about 4000 to about 8000 angstroms.

Referring now to FIG. 2 there is shown a cross-sectional schematic diagram illustrating the results of the next process step in forming the narrow cross-sectional diameter via of the first preferred embodiment of the present invention. Shown in FIG. 2 is the presence of a pair of ozone assisted Chemical Vapor Deposited (CVD) silicon oxide insulator coatings 7a and 7b formed, respectively, upon the top surfaces and exposed edges of the patterned insulator layers 5a and 5b. The method and material through which are formed the ozone assisted Chemical Vapor Deposited (CVD) silicon oxide insulator coatings 7a and 7b are important to the present invention. It has been found experimentally that the ozone assisted Chemical Vapor Deposition (CVD) process preferably employs Tetra Ethyl Ortho Silicate (TEOS) as the silicon source material. It has also been found experimentally that the ozone assisted Chemical Vapor Deposited (CVD) silicon oxide insulator coatings 7a and 7b of the first preferred embodiment of the present invention are preferably formed at a comparatively high ozone:TEOS molar ratio, preferably from about 12:1 to about 20:1. The thickness of the ozone assisted Chemical Vapor Deposited (CVD) silicon oxide insulator coatings 7a and 7b will vary depending upon the deposition time employed for forming the ozone assisted Chemical Vapor Deposited (CVD) silicon oxide insulator coatings 7a and 7b.

The remaining process conditions under which the ozone assisted Chemical Vapor Deposited (CVD) silicon oxide insulator coatings 7a and 7b of the first preferred embodiment of the present invention are formed are a reactor pressure of about 350 to about 550 Torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of about 325 to about 475 degrees centigrade and an oxygen (ozone carrier gas) flow rate of about 4000 to about 6000 standard cubic centimeters per minute (sccm).

Under the conditions listed above, the ozone assisted Chemical Vapor Deposited (CVD) silicon oxide insulator coatings 7a and 7b will exhibit an incubation time of about 50 to about 55 seconds prior to the time at which the ozone assisted Chemical Vapor Deposited (CVD) silicon oxide insulator coatings 7a and 7b will form upon the surface of the titanium nitride layer 3 exposed at the bottom of the conventional via between the patterned insulator layers 5a and 5b. In addition, under the conditions listed above, the ozone assisted Chemical Vapor Deposited (CVD) silicon oxide insulator coatings 7a and 7b will exhibit an incubation time of about 15 to about 20 seconds prior to the time at which the ozone assisted Chemical Vapor Deposited (CVD) silicon oxide insulator coatings 7a and 7b will form upon the surfaces and the exposed edges of the patterned insulator layers 5a and 5b. Thus, for the first preferred embodiment of the present invention, the deposition time for forming the ozone assisted Chemical Vapor Deposited (CVD) silicon oxide insulator coatings 7a and 7b should be greater than about 15 to about 20 seconds and less than about 50 to about 55 seconds.

To maximize the filling of the conventional via and to provide the minimal diameter of the narrow cross-sectional diameter via of the first preferred embodiment of the present invention, the deposition time for forming the ozone assisted Chemical Vapor Deposited (CVD) silicon oxide insulator coatings 7a and 7b is preferably about 50 to about 55 seconds. At about 50 to about 55 seconds, the ozone assisted Chemical Vapor deposited (CVD) silicon oxide insulator coatings 7a and 7b will have grown to a thickness of about 1300 to about 1500 angstroms upon the surfaces and the exposed edges of the patterned insulator layers 5a and 5b. Thus, the diameter D' of the narrow cross-sectional diameter via of the first preferred embodiment of the present invention will be about D-2600 to about D-3000 angstroms at a deposition time for the ozone assisted Chemical Vapor Deposited (CVD) silicon oxide insulator coatings 7a and 7b of about 50 to about 55 seconds.

Alternatively and more preferably, to less maximally fill the conventional via and to provide a more moderate diameter of the narrow cross-sectional diameter via of the first preferred embodiment of the present invention, the deposition time for forming the ozone assisted Chemical Vapor Deposited (CVD) silicon oxide insulator coatings 7a and 7b is preferably about 30 to about 50 seconds. At about 30 to about 50 seconds, the ozone assisted Chemical Vapor deposited (CVD) silicon oxide insulator coatings 7a and 7b will have grown to a thickness of about 500 to about 1300 angstroms upon the surfaces and the exposed edges of the patterned insulator layers 5a and 5b. Thus, the diameter D' of the narrow cross-sectional diameter via of the first preferred embodiment of the present invention will be at from about D-1000 to about D-2600 angstroms at a deposition time for the ozone assisted Chemical Vapor Deposited (CVD) silicon oxide insulator coatings 7a and 7b of about 30 to about 50 seconds.

Having described the first preferred embodiment of the present invention, which represents a general embodiment of the narrow cross-sectional diameter via of the present invention, there will now also be described a more specific embodiment wherein the narrow cross-sectional diameter via of the present invention is formed within an insulator layer within an integrated circuit. This embodiment represents the second Preferred embodiment of the present invention. Referring now to FIG. 3 to FIG. 7 there is shown a series of schematic cross-sectional diagrams which illustrate progressive stages in forming the integrated circuit into which is formed the narrow cross-sectional diameter via of the second preferred embodiment of the present invention.

Figure 3:
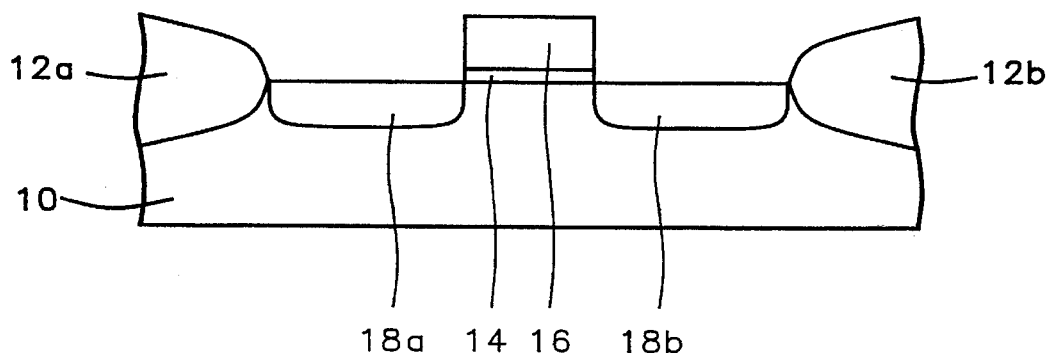
FIG. 3 to FIG. 7 show a series of schematic cross-sectional diagrams illustrating progressive stages in forming the narrow cross-sectional diameter via of the present invention into an integrated circuit which forms the second preferred embodiment of the present invention.

Shown in FIG. 3 is a cross-sectional schematic diagram of the integrated circuit at early stages of its fabrication. FIG. 3 shows a semiconductor substrate 10 upon and within whose surface there are formed isolation regions 12a and 12b. Semiconductor substrates upon which the second preferred embodiment of the present invention may be practiced may be formed with either dopant polarity, any dopant concentration and any crystallographic orientation. Typically, the semiconductor substrate 10 upon which is practiced the second preferred embodiment of the present invention will be a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate.

For the second preferred embodiment of the present invention, the isolation regions 12a and 12b are preferably formed through a thermal oxidation process whereby portions of the semiconductor substrate 10 exposed through an oxidation mask are consumed to form within and upon the semiconductor substrate 10 isolation regions 12a and 12b of silicon oxide.

Also illustrated within FIG. 3 is a gate oxide 14 upon which resides a gate electrode 16. Both the gate oxide 14 and the gate electrode 16 reside upon the active semiconductor region of the semiconductor substrate 10. Both the gate oxide 14 and the gate electrode 16 are components of a field effect transistor.

Methods and materials through which gate oxides and gate electrodes may be formed upon active semiconductor regions of semiconductor substrates are known in the art. Gate oxides may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed by means of patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the second preferred embodiment of the present invention, the gate oxide 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 80 to about 140 angstroms. For the second preferred embodiment of the present invention, the gate electrode 16 is preferably formed by patterning and etching a blanket layer of highly doped polysilicon formed upon the blanket gate oxide layer at a thickness of about 2500 to about 3000 angstroms through a Chemical Vapor Deposition (CVD) process employing silane as the silicon source material, along with suitable dopant species. Once the blanket layer of highly doped polysilicon has been patterned to yield the gate electrode 16, the gate electrode 16 may be used as an etch mask to pattern the gate oxide 14 from the blanket gate oxide layer.

Finally, there is shown in FIG. 3 source/drain electrodes 18a and 18b formed within the surface of the active semiconductor region of the semiconductor substrate 10 at areas not occupied by the gate electrode 16 and the gate oxide 14. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain-electrode. The polarity desired for the source/drain electrode will dictate the polarity of the dopant species. Arsenic dopant species, boron dopant species and phosphorus dopant species are common in the art. For the second preferred embodiment of the present invention, the source/drain electrodes 18a and 18b are preferably formed through implanting a suitable dopant species into the active region of the semiconductor substrate 10 at about 4E13 to about 7E13 ions per square centimeter dose and about 100 to about 130 keV ion implantation energy.

Having formed a field effect transistor structure comprising source/drain electrodes 18a and 18b formed into the active region of the semiconductor substrate 10 defined by the isolation regions 12a and 12b, and a gate electrode 16 upon a gate oxide 14 adjoining the source/drain electrodes 18a and 18b, the important process steps in forming the narrow cross-sectional diameter via of the second preferred embodiment of the present invention may proceed. The results of these important process steps are illustrated in FIG. 4 and FIG. 5.

Figure 4:
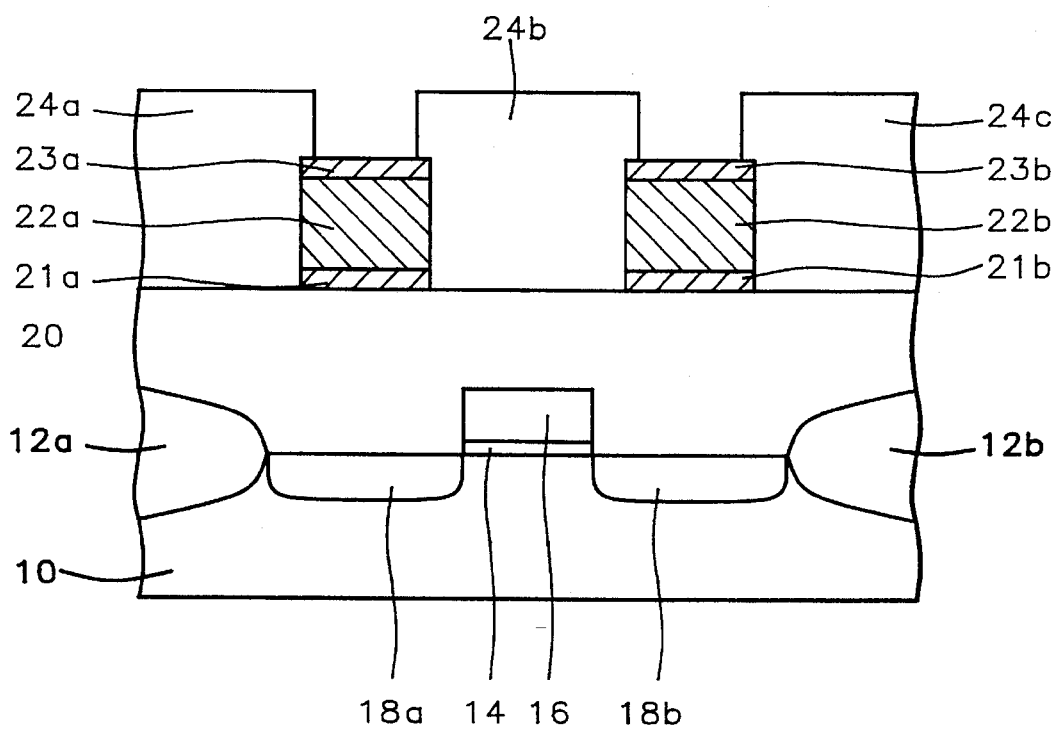
Figure 5:
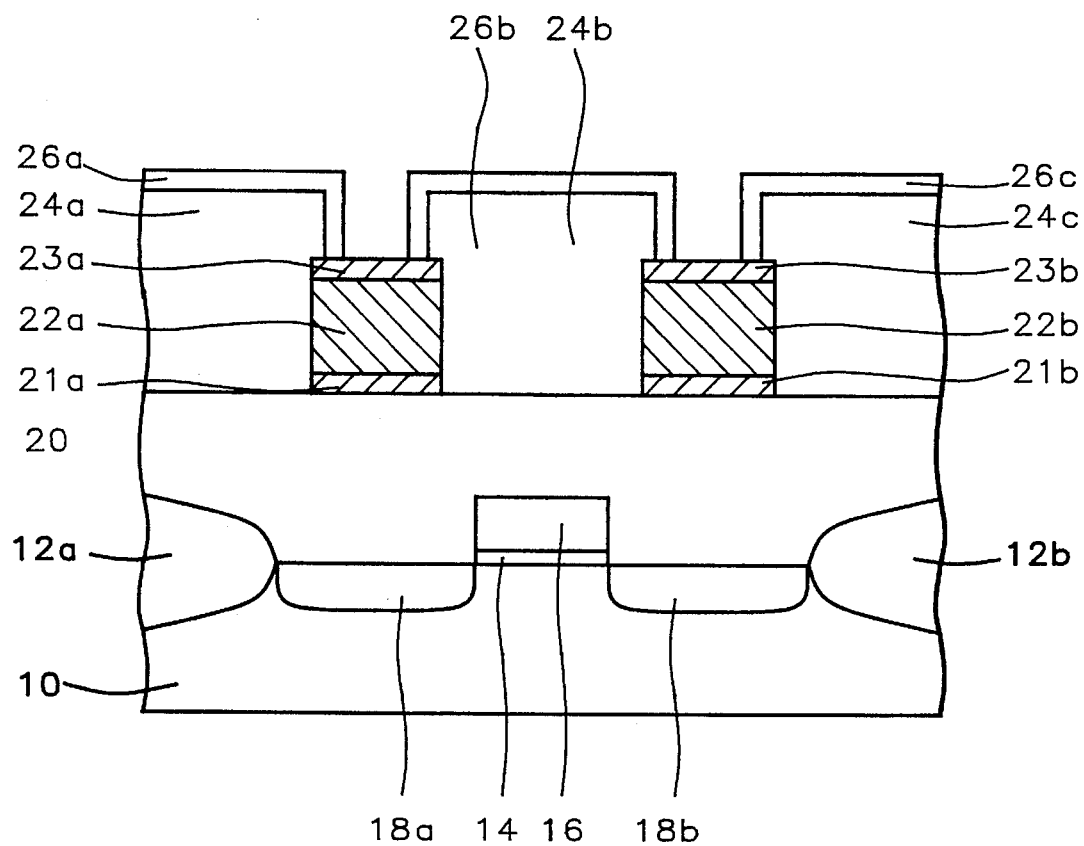

Shown in FIG. 4 is the presence of a blanket first insulator layer 20 formed upon the semiconductor substrate illustrated in FIG. 3. The methods and materials through which the blanket first insulator layer 20 of FIG. 4 is formed are not substantially important to the second preferred embodiment of the present invention. Nonetheless, methods and materials through which blanket insulator layers may be formed within integrated circuits are known in the art. Blanket insulator layers may be formed from insulator materials including but not limited to silicon oxide insulator materials and silicon nitride insulator materials formed upon semiconductor substrates through methods including but not limited to Chemical Vapor Deposition (CVD) methods, Plasma Enhanced Chemical Vapor Deposition (PECVD) methods and Physical Vapor Deposition (PVD) sputtering methods. For the second preferred embodiment of the present invention, the blanket first insulator layer 20 is preferably formed from a silicon oxide insulator material deposited upon the semiconductor substrate 10 through a Plasma Enhanced Chemical Vapor Deposition (PECVD) method employing a suitable silicon source material such as, but not limited to, silane, disilane or Tetra Ethyl Ortho Silicate (TEOS). Blanket insulator layers so formed are known in the art to provide highly dense and impervious insulator layers. The blanket first insulator layer 20 is of a sufficient thickness to adequately cover the features residing upon the semiconductor substrate 10 upon which is formed the blanket first insulator layer 20. The blanket first insulator layer 20 is typically planarized through methods as are conventional in the art, including but not limited to etchback planarizing methods and Chemical Mechanical Polish (CMP) planarizing methods.

Also illustrated in FIG. 4 is the presence of a pair of first multi-layer patterned metal stacks comprising patterned first lower barrier metal layers 21a and 21b, patterned first conductor metal layers 22a and 22b and patterned first upper barrier metal layers 23a and 23b. Methods and materials through which patterned metal layers may be formed in multi-layer patterned metal stacks within integrated circuits are known in the art. Patterned metal layers may be formed into multi-layer patterned metal stacks by means of patterning through methods as are known in the art of blanket metal layers formed upon the surfaces of semiconductor substrates. Blanket metal layers may be formed through methods including but not limited to thermal evaporation methods, Physical Vapor Deposition (PVD) sputtering methods, and Chemical Vapor Deposition (CVD) methods for depositing conductive materials such as metals, metal alloys, metal nitrides and metal silicides.

For the second preferred embodiment of the present invention, the patterned first lower barrier metal layers 21a and 21b are preferably formed of titanium nitride at a thickness of about 800 to about 1200 angstroms. The patterned first conductor metal layers 22a and 22b are preferably formed of an aluminum containing alloy, preferably containing about 0.5 to about 1.0 percent copper, and preferably at a thickness of about 4000 to about 6000 angstroms. Finally, the patterned first upper barrier metal layers 23a and 23b are important to the second preferred embodiment of the present invention. They are formed of titanium nitride, preferably at a thickness of about 1000 to about 1400 angstroms, and preferably through a Physical Vapor Deposition (PVD) sputtering method. The titanium nitride patterned first upper barrier metal layers 23a and 23b correspond with the titanium nitride layer 3 of the first preferred embodiment of the present invention, as illustrated in FIG. 1 and FIG. 2. The patterned first conductor metal layers 22a and 22b correspond with the substrate layer 1, as illustrated in FIG. 1 and FIG. 2.

Finally, there is shown in FIG. 4 the patterned second insulator layers 24a, 24b and 24c. The patterned second insulator layers 24a, 24b and 24c are also important in forming the narrow cross-sectional diameter via of the second preferred embodiment of the present invention. The patterned second insulator layers 24a, 24b and 24c correspond with the patterned insulator layers 5a and 5b, as illustrated in FIG. 1 and FIG. 2. Analogously with the patterned insulator layers 5a and 5b, the patterned second insulator layers 24a, 24b and 24c are preferably formed through patterning via methods as are conventional in the art of a blanket second insulator layer. The blanket second insulator layer is preferably formed from a silicon oxide insulator material deposited through a Chemical Vapor Deposition (CVD) method or a Plasma Enhanced Chemical Vapor Deposition (PECVD) method. The methods typically employ as the silicon source material Tetra Ethyl Ortho Silicate (TEOS), although other silicon source materials, such as silane may also be employed. Preferably, the thicknesses of the patterned second insulator layers 24a, 24b and 24c are from about 15000 to about 20000 angstroms each with respect to the surface of the blanket first insulator layer. Preferably, the diameter of the first conventional via between the patterned second insulator layers 24a and 24b and the diameter of the second conventional via between the patterned second insulator layers 24b and 24c is from about 4000 to about 8000 angstroms.

Referring now to FIG. 5 there is shown a schematic cross-sectional diagram which illustrates the next important process step in forming the narrow cross-sectional diameter via of the second preferred embodiment of the present invention. Shown in FIG. 5 is the presence of the first ozone assisted Chemical Vapor Deposited (CVD) silicon oxide insulator coatings 26a, 26b and 26c. The first ozone assisted Chemical Vapor Deposited (CVD) silicon oxide insulator coatings 26a, 26b and 26c correspond with the ozone assisted Chemical Vapor Deposited (CVD) silicon oxide insulator coatings 7a and 7b illustrated within FIG. 1 and FIG. 2. The first ozone assisted Chemical Vapor Deposited (CVD) silicon oxide insulator coatings 26a, 26b and 26c are important to practice of the second preferred embodiment of the present invention.

Analogously with the ozone assisted Chemical Vapor Deposited (CVD) silicon oxide insulator coatings 7a and 7b, the first ozone assisted Chemical Vapor Deposited (CVD) silicon oxide insulator coatings 26a, 26b and 26c also are preferably formed from Tetra Ethyl Ortho Silicate (TEOS) as the silicon source material. Similarly, the first ozone assisted Chemical Vapor Deposited (CVD) silicon oxide insulator coatings 26a, 26b and 26c are preferably formed at a comparatively high ozone:TEOS molar ratio, preferably from about 12:1 to about 20:1. Also similarly, the thickness of the first ozone assisted Chemical Vapor Deposited (CVD) silicon oxide insulator coatings 26a, 26b and 26c will vary depending upon the deposition time employed for forming the first ozone assisted Chemical Vapor Deposited (CVD) silicon oxide insulator coatings 26a, 26b and 26c.

The remaining process conditions under which the first ozone assisted Chemical Vapor Deposited (CVD) silicon oxide insulator coatings 26a, 26b and 26c of the second preferred embodiment of the present invention are formed are a reactor pressure of about 350 to about 550 Torr, a Tetra Ethyl Ortho Silicate (TEOS) flow rate of about 27 to about 42 standard cubic centimeters per minute (sccm), a background helium flow rate of about 1850 to about 2750 standard cubic centimeters per minute (sccm), a deposition temperature of about 325 to about 475 degrees centigrade and an oxygen (ozone carrier gas) flow rate of about 4000 to about 6000 standard cubic centimeters per minute (sccm).

Under these conditions, the first ozone assisted Chemical Vapor Deposited (CVD) silicon oxide insulator coatings 26a, 26b and 26c will exhibit an incubation time of about 50 to about 55 seconds prior to the time at which the first ozone assisted Chemical Vapor Deposited (CVD) silicon oxide insulator coatings 26a, 26b and 26c will form upon the surface of the titanium nitride patterned first upper barrier metal layers 23a and 23b exposed at the bottoms of the first conventional via between the patterned second insulator layers 24a and 24b, and the second conventional via between the patterned second insulator layers 24b and 24c, respectively. In addition, under the conditions listed above, the first ozone assisted Chemical Vapor Deposited (CVD) silicon oxide insulator coatings 26a, 26b and 26c will exhibit an incubation time of about 15 to about 20 seconds prior to the time at which the first ozone assisted Chemical Vapor Deposited (CVD) silicon oxide insulator coatings 26a, 26b and 26c will form upon the surfaces and the exposed edges of the patterned second insulator layers 24a, 24b and 24c, respectively. Finally, the first ozone assisted Chemical Vapor Deposited (CVD) silicon oxide insulator coatings 26a, 26b and 26c will also exhibit an incubation time of about 50 to about 55 seconds prior to the time at which the first ozone assisted Chemical Vapor Deposited (CVD) silicon oxide insulator coatings 26a, 26b and 26c will form upon the surfaces of the titanium nitride patterned first upper barrier metal layers 23a and 23b.

Thus, for the second preferred embodiment of the present invention, the deposition time for forming the first ozone assisted Chemical Vapor Deposited (CVD) silicon oxide insulator coatings 26a, 26b and 26c should be greater than about 15 to about 20 seconds and less than about 50 to about 55 seconds. To maximize the filling of the first conventional via between the patterned second insulator layers 24a and 24b, and the second conventional via between the patterned second insulator layers 24b and 24c, while simultaneously providing the minimal diameter of the narrow cross-sectional diameter via of the second preferred embodiment of the present invention, the deposition time is preferably about 50 to about 55 seconds. At about 50 to about 55 seconds, the first ozone assisted Chemical Vapor deposited (CVD) silicon oxide insulator coatings 26a, 26b and 26c will have grown to the thickness of about 1300 to about 1500 angstroms. Thus, the diameters of the first and the second narrow cross-sectional diameter vias of the second preferred embodiment of the present invention, which are formed respectively, from the first conventional via and the second conventional via, will each have a diameter of from about 2600 to about 3000 angstroms less than the diameters of the conventional vias from which they are formed at a deposition time for the first ozone assisted Chemical Vapor Deposited (CVD) silicon oxide insulator coatings 26a, 26b and 26c of about 50 to about 55 seconds.

Alternatively and more preferably, to less maximally fill the first conventional via and the second conventional via, and to provide a more moderate diameter of the narrow cross-sectional diameter vias of the second preferred embodiment of the present invention, the deposition time for the first ozone assisted Chemical Vapor Deposited (CVD) silicon oxide insulator coatings 26a, 26b and 26c is preferably about 30 to about 50 seconds. At about 30 to about 50 seconds, the first ozone assisted Chemical Vapor deposited (CVD) silicon oxide insulator coatings 26a, 26b and 26c will have grown to the thickness of about 500 to about 1300 angstroms. Thus, the diameters of the first and the second narrow cross-sectional diameter vias of the second preferred embodiment of the present invention, which are formed respectively, from the first conventional via and the second conventional via will each have a diameter of from about 1000 to about 2600 angstroms less than the diameter of the conventional via from which it was formed at a deposition time for the first ozone assisted Chemical Vapor Deposited (CVD) silicon oxide insulator coatings 26a, 26b and 26c of about 30 to about 50 seconds.

Figure 6:
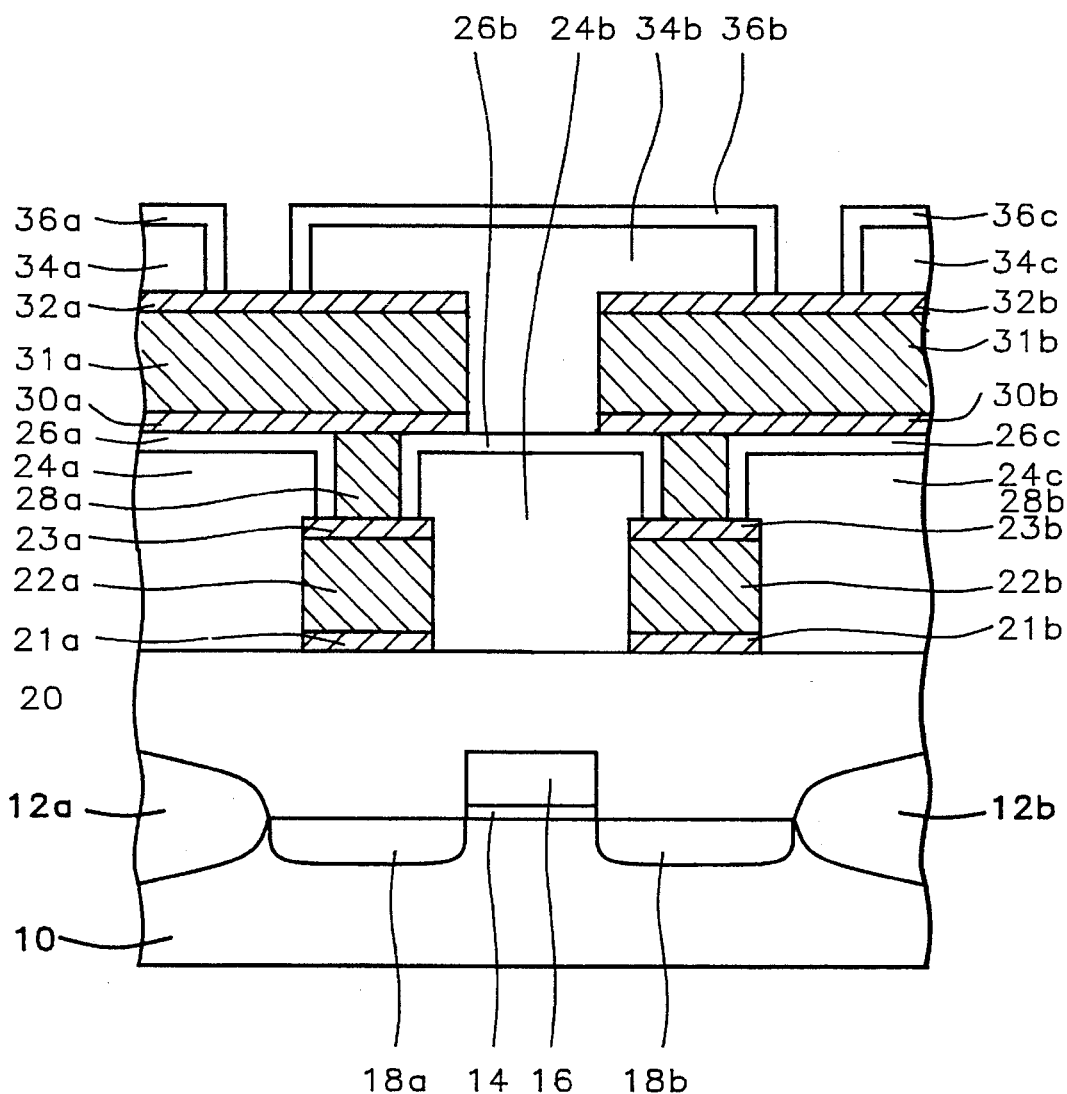

Referring now to FIG. 6, there is shown a cross-sectional schematic diagram illustrating the results of the next series of process steps in forming the narrow cross-sectional diameter via of the second preferred embodiment of the present invention. Shown in FIG. 6 is the presence of a pair of first conductive contact studs 28a and 28b. Methods and materials through which conductive contact studs may be formed are known within the art of integrated circuit manufacture. Conductive contact studs are typically formed of metals, metal alloys, highly doped polysilicon and polycides (polysilicon/metal silicide stacks) deposited within vias through deposition methods including but not limited to evaporative deposition methods, Chemical Vapor Deposition (CVD) methods and Physical Vapor Deposition (PVD) sputtering methods. Excess quantities of conductive materials from which are formed conductive contact studs may be removed from surfaces surrounding the via into which the conductive contact stud is formed through etchback and Chemical Mechanical Polish (CMP) methods as are conventional in the art. For the second preferred embodiment of the present invention, the pair of first conductive contact studs 28a and 28b is preferably formed at least in part of tungsten metal deposited through a Chemical Vapor Deposition (CVD) method, as is most common in the art. The first conductive contact studs 28a and 28b are formed of sufficient height to reach the top surfaces of the first ozone assisted Chemical Vapor Deposited (CVD) silicon oxide insulator coatings 26a, 26b and 26c.

As is understood by a person skilled in the art, additional integrated circuit structures such as additional multi-layer patterned metal stacks, additional patterned insulator layers, additional ozone assisted Chemical Vapor Deposited (CVD) silicon oxide insulator coatings and additional conductive contact studs may be formed upon the semiconductor substrate 10 after the first conductive contact studs 28a and 28b have been formed to contact the titanium nitride patterned first upper barrier metal layers 23a and 23b. Some of these additional structures are also illustrated in FIG. 6, other additional structures are illustrated in FIG. 7.

Also illustrated in FIG. 6 is: (1) a pair of second multi-layer patterned metal stacks comprised of patterned second lower barrier metal layers 30a and 30b, patterned second conductor metal layers 31a and 31b and patterned second upper barrier metal layers 32a and 32b; (2) patterned third insulator layers 34a, 34b and 34c; and (3) second ozone assisted Chemical Vapor Deposited (CVD) silicon oxide insulator coatings 36a, 36b and 36c. The pair of second multi-layer patterned metal stacks is formed through methods, materials and thicknesses equivalent to the methods, materials and thicknesses through which are formed the pair of first multi-layer patterned metal stacks. The patterned third insulator layers 34a, 34b and 34c are formed through methods, materials and thicknesses equivalent to the methods, materials and thicknesses through which are formed the patterned second insulator layers 24a, 24b and 24c. Finally, the second ozone assisted Chemical Vapor Deposited (CVD) silicon oxide insulator coatings 36a, 36b and 36c are formed through methods, materials and thicknesses equivalent to the methods, materials and thickness through which are formed the first ozone assisted Chemical Vapor Deposited (CVD) silicon oxide insulator coatings 26a, 26b and 26c.

Figure 7:
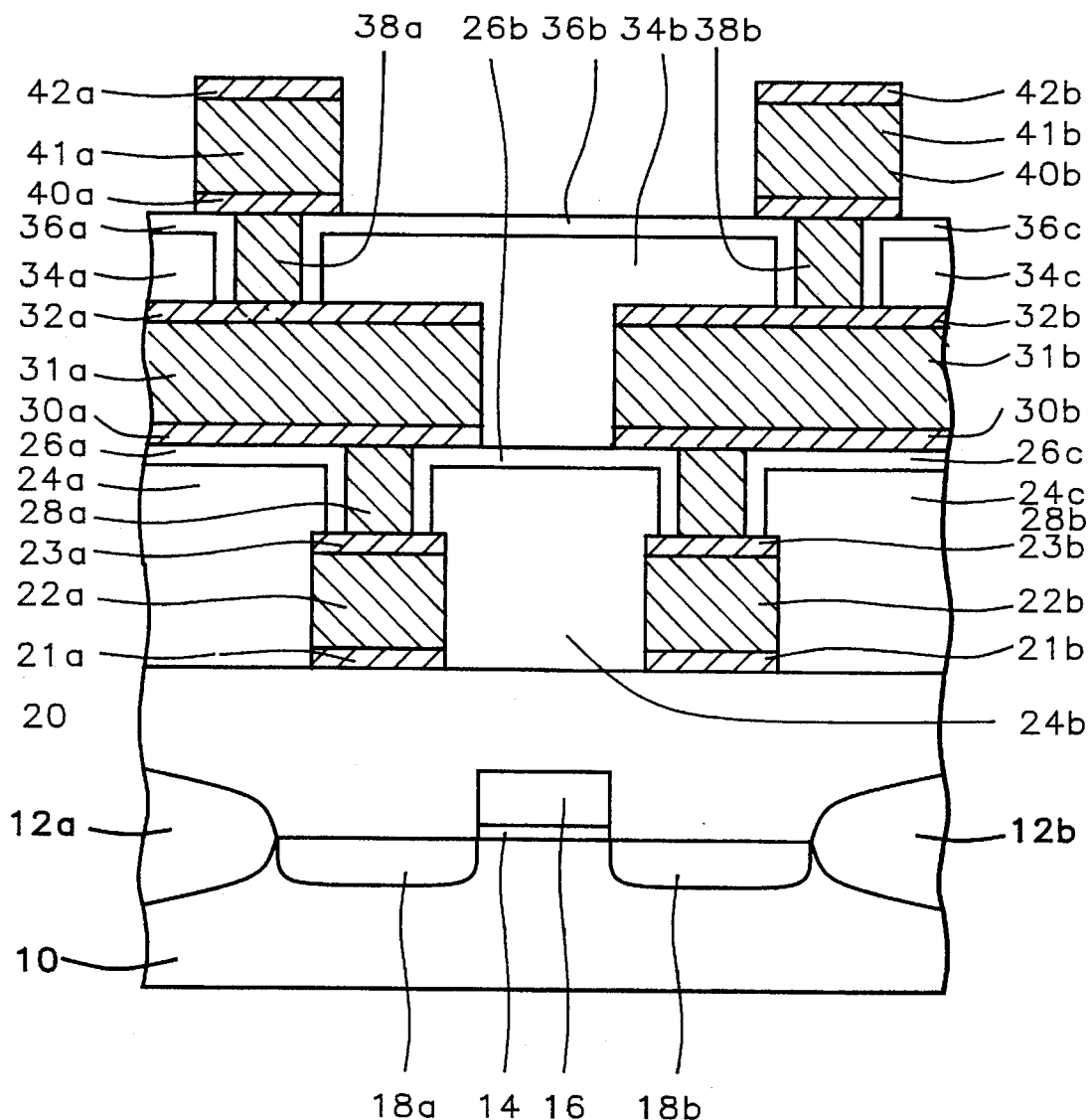

Referring now to FIG. 7, there is shown a schematic cross-sectional diagram illustrating the results of the last series of process steps in forming the narrow cross-sectional diameter via of the second preferred embodiment of the present invention. Shown in FIG. 7 is a pair of second conductive contact studs 38a and 38b; and a pair of third multi-layer patterned metal stacks comprising patterned third lower barrier metal layers 40a and 40b, patterned third conductor metal layers 41a and 41b and patterned third upper barrier metal layers 42a and 42b. The methods, materials and thicknesses from which are formed the second conductive contact studs 38a and 38b are equivalent to the methods, materials and thicknesses through which are formed the first conductive contact studs 28a and 28b. The methods, materials and thicknesses through which are formed the three patterned metal layers within the third multi-layer patterned metal stacks are equivalent to the methods, materials and thicknesses employed in forming the three patterned metal layers within the second multi-layer patterned metal stacks and the first multi-layer patterned metal stacks.

Upon forming the pair of third multi-layer patterned metal stacks, there is formed the integrated circuit of the second preferred embodiment of the present invention. The integrated circuit has formed therein a multiplicity of narrow cross-sectional diameter vias of the present invention, within which vias are formed conductive contact studs connecting multiple patterned metal stacks within the integrated circuit. The narrow cross-sectional diameter vias formed in accord with the second preferred embodiment of the present invention are formed without the need for fundamental advances in photolithographic or etching technology. In addition, the narrow cross-sectional diameter vias formed within the second preferred embodiment of the present invention require no additional etching of the narrow cross-sectional via, once formed. Finally, the method through which is formed the narrow cross-sectional diameter vias of the second preferred embodiment of the present invention is both manufacturable and economical.

EXAMPLES

Figure 8:
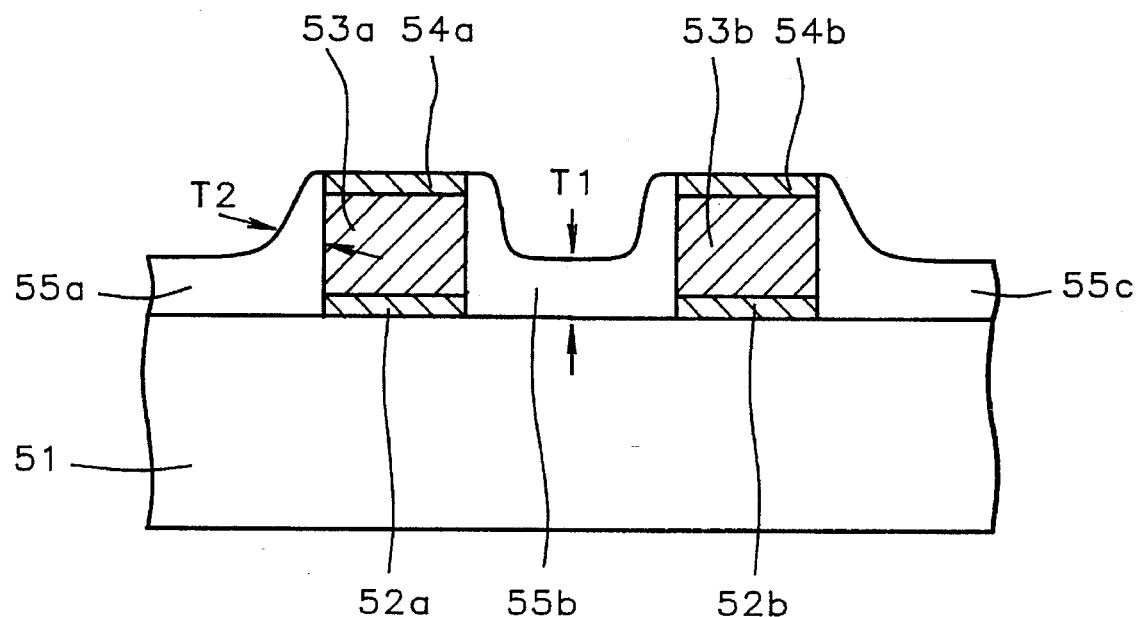
FIG. 8 shows a schematic cross-sectional diagram illustrating a test structure employed for determining comparative growth rates and comparative incubation times for forming ozone assisted Chemical Vapor Deposited (CVD) silicon oxide insulator coatings upon various integrated circuit substrate materials.

Upon the surfaces of three (100) silicon semiconductor substrate wafers was formed the structure illustrated in FIG. 8. Illustrated in FIG. 8 is an insulator layer 51 upon whose surface resides a pair of multi-layer patterned metal stacks comprised of titanium nitride patterned lower barrier metal layers 52a and 52b, aluminum containing alloy patterned conductor metal layers 53a and 53b and titanium nitride patterned upper barrier metal layers 54a and 54b.

The insulator layer 51 was a silicon oxide insulator layer formed to a thickness of about 10000 angstroms through a Plasma Enhanced Chemical Vapor Deposition (PECVD) process employing Tetra Ethyl Ortho Silicate (TEOS) as the silicon source material. The process parameters included a Tetra Ethyl Ortho Silicate flow rate of about 800 standard cubic centimeters per minute (sccm), an oxygen flow rate of about 600 standard cubic centimeters per minute (sccm), a helium flow rate of about 800 standard cubic centimeters per minute (sccm) and a radio frequency power of about 675 watts.

Upon the insulator layer 51 were formed the titanium nitride patterned lower barrier metal layers 52a and 52b through a Physical Vapor Deposition (PVD) sputtering process employing a titanium nitride target. The titanium nitride patterned lower barrier metal layers 52a and 52b were about 1000 angstroms thick each.

Upon the titanium nitride patterned lower barrier metal layers were formed aluminum containing alloy patterned conductor metal layers 53a and 53b through a Physical Vapor Deposition (PVD) sputtering process. The aluminum containing alloy patterned conductor metal layers 53a and 53b were formed at a thickness of about 4000 angstroms from an aluminum alloy containing about 1 percent copper.

Upon the aluminum containing alloy patterned conductor metal layers 53a and 53b were formed titanium nitride patterned upper barrier metal layers 54a and 54b through a Physical Vapor Deposition (PVD) sputtering process employing a titanium nitride target. The titanium nitride patterned upper barrier metal layers 54a and 54b were about 1200 angstroms thick each.

Upon each of the three semiconductor wafers having the equivalent insulator layers 51 and three-layer patterned metal stacks illustrated in FIG. 8 was then formed the ozone assisted Chemical Vapor Deposited (CVD) silicon oxide insulator coatings 55a, 55b and 55c, as illustrated in FIG. 8. The ozone assisted Chemical Vapor Deposited (CVD) silicon oxide insulator coatings 55a, 55b and 55c were formed in accord with the preferred embodiments of the present invention, employing Tetra Ethyl Ortho Silicate (TEOS) as the silicon source material at an ozone:TEOS molar ratio of about 14:1. Additional parameters under which the ozone assisted Chemical Vapor Deposited (CVD) silicon oxide insulator coatings 55a, 55b and 55c were formed included a reactor chamber pressure of about 450 Torr, a Tetra Ethyl Ortho Silicate (TEOS) flow of about 35 standard cubic centimeters per minute (sccm), a background helium flow rate of about 2300 standard cubic centimeters per minute (sccm), a temperature of about 400 degrees centigrade and an oxygen flow rate (ozone carrier gas) of about 5000 standard cubic centimeters per minute (sccm). The ozone assisted Chemical Vapor Deposited (CVD) silicon oxide insulator coatings 55a, 55b and 55c were formed upon each of the three equivalent semiconductor substrates for a different time interval. The time intervals were 50 seconds, 150 seconds and 300 seconds.

After the ozone assisted Chemical Vapor Deposited (CVD) silicon oxide insulator coatings 55a, 55b and 55c were formed upon the three equivalent semiconductor substrates at the three time intervals, there was measured: (1) the thicknesses of the ozone assisted Chemical Vapor Deposited (CVD) silicon oxide insulator coatings 55a, 55b and 55c over the insulator layers 51 (corresponding to T1 in FIG. 8); (2) the thicknesses of the three ozone assisted Chemical Vapor Deposited (CVD) silicon oxide insulator coatings 55a, 55b and 55c adjoining the exposed edges of the aluminum containing alloy patterned conductor metal layers 53a and 53b (corresponding to T2 in FIG. 1); and, (3) the thicknesses of the three ozone assisted Chemical Vapor Deposited silicon oxide insulator coatings 55a, 55b and 55c over the titanium nitride patterned upper barrier metal layers 54a and 54b. For the semiconductor substrate upon which the ozone assisted Chemical Vapor Deposited (CVD) silicon oxide insulator coatings 55a, 55b and 55c were formed for 50 seconds, there was no ozone assisted Chemical Vapor Deposited (CVD) silicon oxide insulator coating formed upon the titanium nitride patterned upper barrier metal layers 54a and 54b.

Figure 9:
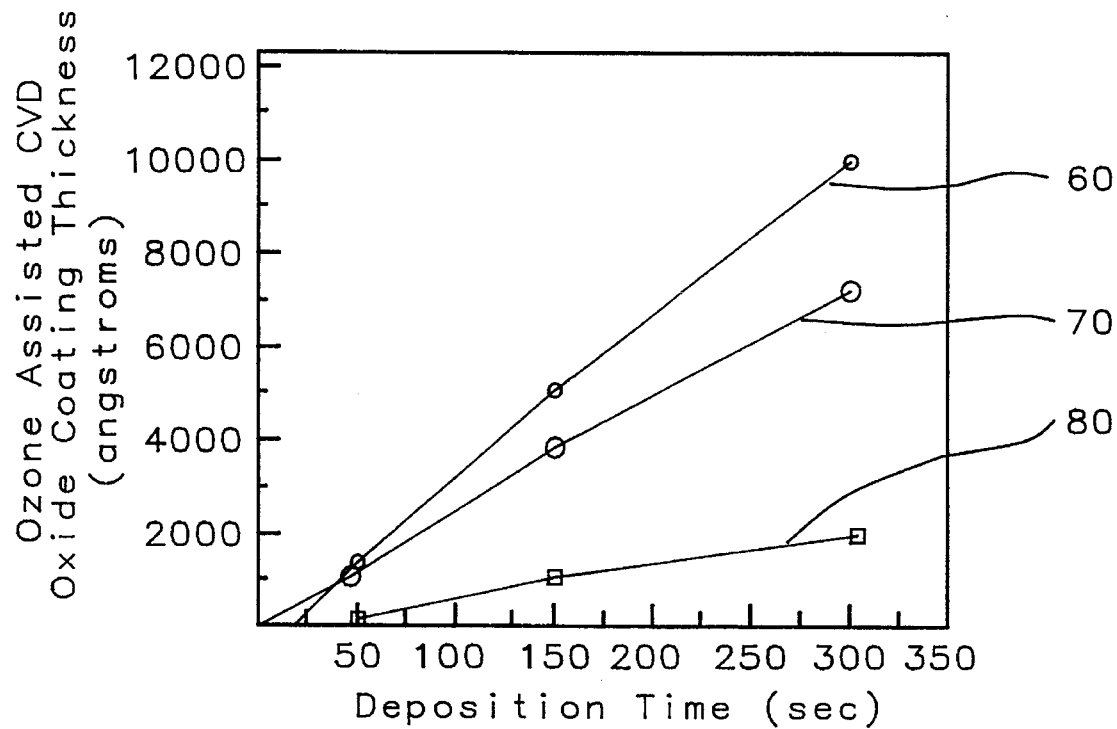
FIG. 9 shows a graph of Ozone Assisted CVD Silicon Oxide Coating Thickness versus Deposition Time for an ozone assisted Chemical Vapor Deposited (CVD) silicon oxide insulator coating formed upon the test structure illustrated in FIG. 8.

The measured thicknesses described above were plotted to yield the graph of FIG. 9. Within FIG. 9, line 60 corresponds to the thicknesses of the ozone assisted Chemical Vapor Deposited (CVD) silicon oxide insulator coatings 55a, 55b and 55c formed over the insulator layers 51 (corresponding to T1 in FIG. 1) as a function of deposition time. Line 70 corresponds to the thicknesses of the ozone assisted Chemical Vapor Deposited (CVD) silicon oxide insulator coatings 55a, 55b and 55c adjoining the exposed edges of the aluminum containing alloy patterned conductor metal layers 53a and 53b (corresponding to T2 in FIG. 1) as a function of deposition time. Finally, line 80 corresponds to the thicknesses of the ozone assisted Chemical Vapor Deposited (CVD) silicon oxide insulator coatings 55a, 55b and 55c formed over the titanium nitride patterned upper barrier metal layers 54a and 54b as a function of deposition time. From lines 60, 70 and 80 were calculated: (1) the slopes which correspond to the deposition rates of the ozone assisted Chemical Vapor Deposited (CVD) silicon oxide insulator coatings 55a, 55b and 55c upon the individual substrate materials; and, (2) the x-axis intercepts which correspond to the incubation times for forming the ozone assisted Chemical Vapor Deposited (CVD) silicon oxide insulator coatings 55a, 55b and 55c upon those individual substrate materials. The deposition rates and incubation times are reported in TABLE I.

TABLE I

OZONE-TEOS INSULATOR COATING FORMATION RATES AND INCUBATION TIMES

| Substrate Layer | Deposition Rate | Incubation Time |
| --- | --- | --- |
| Titanium Nitride | 513 angstroms/min. | 52.7 seconds |
| Aluminum 1% Copper | 1442 | 0.0 |
| PECVD-TEOS | 2280 | 15.6 |

From review of the data in TABLE I it is seen that a more substantial incubation time exists for the formation of ozone assisted Chemical Vapor Deposited (CVD) silicon oxide insulator coatings upon titanium nitride substrate layers than upon Plasma Enhanced Chemical Vapor Deposited (PECVD) silicon oxide insulator substrate layers. The presence of this difference in incubation time makes possible the method of the present invention by which narrow cross-sectional diameter vias may be formed within insulator layers within integrated circuits.

As is understood by a person skilled in the art, the preferred embodiments and EXAMPLES by which is described the present invention are illustrative of the present invention rather than limiting of the present invention. Revisions to methods and materials through which is formed the preferred embodiments and EXAMPLES of the present invention may yield additional embodiments and EXAMPLES which are within the spirit and scope of the present invention.

What is claimed is:

1. A method for forming an insulator layer having a cross-sectional diameter via formed there-through for use within an integrated circuit comprising:

forming upon a semiconductor substrate a metal layer, at least the top surface of the metal layer being formed from a titanium nitride layer;

forming upon the titanium nitride layer an insulator layer, the insulator layer exhibiting a first incubation time with respect to forming an ozone assisted Chemical Vapor Deposited (CVD) silicon oxide insulator coating upon the insulator layer, the first incubation time being less than a second incubation time for forming the ozone assisted Chemical Vapor Deposited (CVD) silicon oxide insulator coating upon the titanium nitride layer;

forming completely through the insulator layer a via, the bottom of the via exposing a portion of the titanium nitride layer;

forming upon the surface of the insulator layer and upon the edges of the insulator layer exposed in the via the ozone assisted Chemical Vapor Deposited (CVD) silicon oxide insulator coating, the ozone assisted Chemical Vapor Deposited (CVD) silicon oxide insulator coating being deposited for a deposition time greater than the first incubation time, but no greater than the second incubation time.

2. The method of claim 1 wherein the thickness of the titanium nitride layer is from about 1000 to about 1400 angstroms.

3. The method of claim 1 wherein the titanium nitride layer is formed through a Physical Vapor Deposition (PVD) sputtering method.

4. The method of claim 1 wherein the thickness of the insulator layer is from about 15000 to about 20000 angstroms.

5. The method of claim 1 wherein the insulator layer is formed from an insulator material chosen from the group of insulator materials consisting of silicon oxide insulator materials formed through a Plasma Enhanced Chemical Vapor Deposition (PECVD) process and silicon oxide insulator materials formed through a Chemical Vapor Deposition (CVD) process.

6. The method of claim 1 wherein the width of the via is from about 4000 to about 8000 angstroms.

7. The method of claim 1 wherein the thickness of the ozone assisted Chemical Vapor Deposited (CVD) silicon oxide insulator coating is from about 500 to about 1300 angstroms.

8. The method of claim 1 wherein the thickness of the ozone assisted Chemical Vapor Deposited (CVD) silicon oxide insulator coating is from about 1300 to about 1500 angstroms.

9. The method of claim 1 wherein the ozone assisted Chemical Vapor Deposited (CVD) silicon oxide insulator coating employs Tetra Ethyl Ortho Silicate (TEOS) as the silicon source material.

10. The method of claim 9 wherein the ozone assisted Chemical Vapor Deposited (CVD) silicon oxide insulator coating is formed at an ozone:TEOS molar ratio of about 12:1 to about 20:1.

11. The method of claim 1 wherein the first incubation time is from about 15 to about 20 seconds and the second incubation time is from about 50 to about 55 seconds.

12. A method for forming an integrated circuit having an insulator layer formed therein, the insulator layer having a cross-sectional diameter via formed there-through comprising:

forming within and upon a semiconductor substrate an integrated circuit comprising a minimum of one field effect transistor;

forming upon the semiconductor substrate a metal layer, at least the top surface of the metal layer being formed from a titanium nitride layer;

forming upon the titanium nitride layer an insulator layer, the insulator layer exhibiting a first incubation time with respect to forming an ozone assisted Chemical Vapor Deposited (CVD) silicon oxide insulator coating upon the insulator layer, the first incubation time being less than a second incubation time for forming the ozone assisted Chemical Vapor Deposited (CVD) silicon oxide insulator coating upon the titanium nitride layer;

forming completely through the insulator layer a via, the bottom of the via exposing a portion of the titanium nitride layer;

forming upon the surface of the insulator layer and upon the edges of the insulator layer exposed in the via the ozone assisted Chemical Vapor Deposited (CVD) silicon oxide insulator coating, the ozone assisted Chemical Vapor Deposited (CVD) silicon oxide insulator coating being deposited for a deposition time greater than the first incubation time, but no greater than the second incubation time.

13. The method of claim 12 wherein the thickness of the titanium nitride layer is from about 1000 to about 1400 angstroms, and the titanium nitride layer is formed through a Physical Vapor Deposition (PVD) sputtering method.

14. The method of claim 12 wherein the thickness of the insulator layer is from about 15000 to about 20000 angstroms.

15. The method of claim 12 wherein the insulator layer is formed from an insulator material chosen from the group of insulator materials consisting of silicon oxide insulator materials formed through a Plasma Enhanced Chemical Vapor Deposition (PECVD) process and silicon oxide insulator materials formed through a Chemical Vapor Deposition (CVD) process.

16. The method of claim 12 wherein the width of the via is from about 4000 to about 8000 angstroms.

17. The method of claim 12 wherein the thickness of the ozone assisted Chemical Vapor Deposited (CVD) silicon oxide insulator coating is from about 500 to about 1300 angstroms.

18. The method of claim 12 wherein the thickness of the ozone assisted Chemical Vapor Deposited (CVD) silicon oxide insulator coating is from about 1300 to about 1500 angstroms.

19. The method of claim 12 wherein the ozone assisted Chemical Vapor Deposited (CVD) silicon oxide insulator coating employs Tetra Ethyl Ortho Silicate (TEOS) as the silicon source material.

20. The method of claim 19 wherein the ozone assisted Chemical Vapor Deposited (CVD) silicon oxide insulator coating is formed at an ozone:TEOS molar ratio of about 12:1 to about 20:1.

21. The method of claim 12 wherein the first incubation time is from about 15 to about 20 seconds and the second incubation time is from about 50 to about 55 seconds.

* * * * *